United States Patent
Chen

(10) Patent No.: US 9,524,890 B2
(45) Date of Patent: Dec. 20, 2016

(54) COMPUTER VISUAL RECOGNITION OUTPUT IMAGE-AIDED LED DIE SORTING SYSTEM AND SORTING METHOD

(71) Applicant: Yealy Optic Electronic Co., LTD., Taipei (TW)

(72) Inventor: Ching-Po Chen, Taipei (TW)

(73) Assignee: YEALY OPTIC ELECTRONIC CO., LTD., Taipei (TW)

( * ) Notice: Subject to any disclaimer, the term of this patent is extended or adjusted under 35 U.S.C. 154(b) by 0 days.

(21) Appl. No.: 14/576,864

(22) Filed: Dec. 19, 2014

(65) Prior Publication Data

US 2015/0357216 A1    Dec. 10, 2015

(30) Foreign Application Priority Data

Jun. 6, 2014    (TW) .............................. 103119708 A

(51) Int. Cl.
*H01L 21/67* (2006.01)
*H01L 33/00* (2010.01)

(52) U.S. Cl.
CPC ..... *H01L 21/67271* (2013.01); *H01L 33/0095* (2013.01)

(58) Field of Classification Search
None
See application file for complete search history.

(56) References Cited

U.S. PATENT DOCUMENTS

| | | | | |
|---|---|---|---|---|
| 6,222,145 B1* | 4/2001 | Cook | ....................... | B07C 5/34 |
| | | | | 209/573 |
| 6,477,265 B1* | 11/2002 | Sheng | .................... | G06T 7/0002 |
| | | | | 250/491.1 |
| 7,227,628 B1* | 6/2007 | Sullivan | ............. | G01N 21/9501 |
| | | | | 250/559.46 |
| 2007/0173970 A1* | 7/2007 | Shachar | ............... | G05B 19/128 |
| | | | | 700/225 |
| 2008/0116278 A1* | 5/2008 | Epshteyn | .......... | G06F 17/30879 |
| | | | | 235/462.25 |

* cited by examiner

*Primary Examiner* — Chan Park
*Assistant Examiner* — Geoffrey E Summers
(74) *Attorney, Agent, or Firm* — Muncy, Geissler, Olds & Lowe, P.C.

(57) ABSTRACT

The invention relates to computer visual recognition output image-aided LED die sorting system and sorting method. The computer visual recognition output image-aided LED die sorting system comprises an optical inspection device, a scanning device, a tablet computer device and a die sucking device. The scanning device scans an inspection result of the optical inspection device and transfers the scan data to the tablet computer device, and then the tablet computer device displays a recognition signal for a user to determine rapidly. Meanwhile, the sorting method can be performed to decrease the manpower cost and enhance the quality yield and production speed.

9 Claims, 13 Drawing Sheets

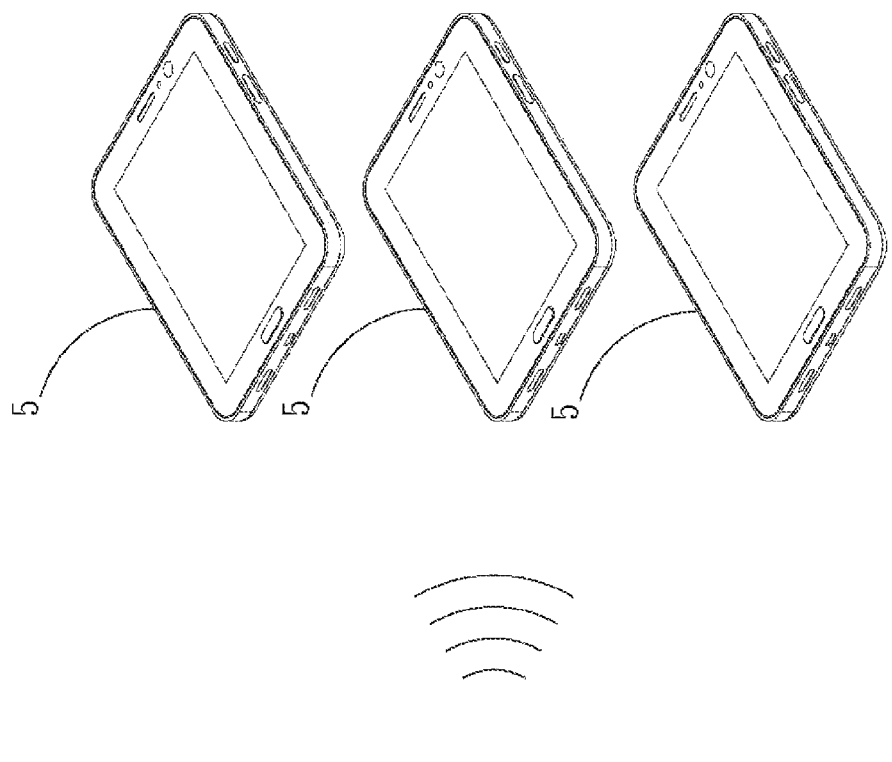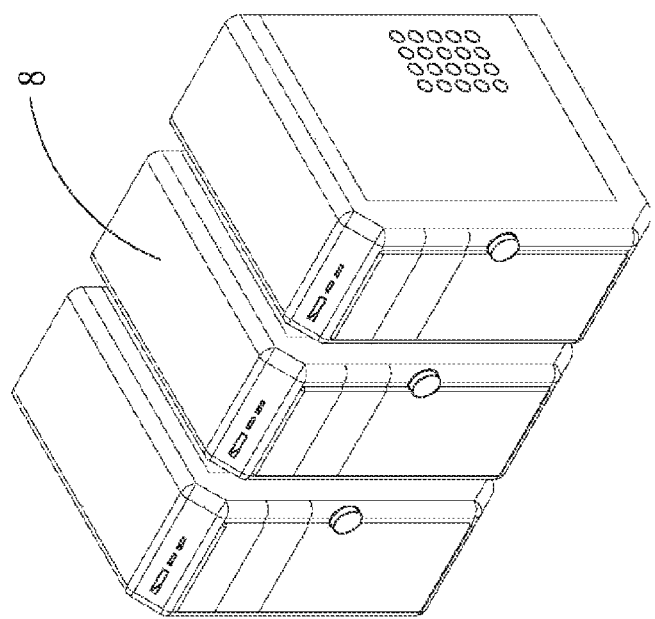
FIG. 10

COMPUTER VISUAL RECOGNITION OUTPUT IMAGE-AIDED LED DIE SORTING SYSTEM AND SORTING METHOD

BACKGROUND OF THE INVENTION (1) Field of the Invention

The invention relates to light-emitting diode (LED) die sorting system and sorting method, and more particularly to computer visual recognition output image-aided LED die sorting system and sorting method using a computer tablet to output an inspection result.

(2) Description of the Prior Art

When the chip on glass (COG) technology becomes more and more popular, the inspection requirements of the COG die also grow rapidly. In addition to the wafer-stage inspection, the inspection of the die placed on the carrier plate before the die is mounted on the display panel also becomes essential in order to increase the production yield and decrease the repairing or re-working opportunity. In order to satisfy these inspection requirements, a few die inspection systems for inspecting the dies on the carrier plate have been developed.

The use of the automatic optical inspection (AOI) instrument also gradually becomes important. The AOI is used to inspect the product according to the optical image and image comparison inspection technology, and is continuously developed based on the inspection requirements on the slim and light, and high-density electronic products, so that various bad processes of the elements can be effectively inspected without the test jig and the electronic measurement and without damaging the product.

Also, the typical wafer inspection is mainly divided into two stages. The first stage is the entire wafer inspection, in which the wafer is disposed in an AOI instrument, which performs the large-range scan to perform the inspection, and then the scanning electron microscope is used to perform the inspection artificially. The defect wafer samples, obtained after the inspection of the AOI instrument, are further judged. Regarding the die inspection, the diced dies are artificially inspected by the electron microscope, and the defect die is picked out. However, the artificial inspection needs the significantly increased inspection cost. First, many artificial costs have to be spent. Next, the artificial picking out of the die needs many education and training processes so that the defect die can be visually obtained effectively. Furthermore, there are many dies used, so the corresponding requirement conditions also become relatively complicated. In addition, the overall quality yield of the artificial inspection method cannot be effectively maintained, and the inspection speed is also relatively decreased. So, the prior art has the following drawbacks.

First, the inspection cost is high. Second, the overall quality yield cannot be effectively maintained. Third, the inspection speed is low.

Therefore, it is a key issue for the inventor(s) and those skilled in the art to solve the above-mentioned conventional problems and drawbacks.

SUMMARY OF THE INVENTION

In order to effectively solve the above-mentioned problems, a main object of the invention is to provide a computer visual recognition output image-aided LED die sorting system capable of effectively decreasing the manpower cost while increasing the quality yield and production speed.

Another object of the invention is to provide a computer visual recognition output image-aided LED die sorting system capable of effectively decreasing the manpower cost while increasing the quality yield and production speed.

To achieve the above-identified objects, the invention provides a computer visual recognition output image-aided LED die sorting system comprising an optical inspection device, a scanning device, a tablet computer device and a die sucking device. The optical inspection device mainly has at least one carrier jig, on which a plurality of wafer positioning modules for positioning wafers may be disposed, wherein each of the wafers has a plurality of LED dies, and the optical inspection device inspects the wafer and generates at least one wafer report comprising a bar code and inspection data. The scanning device scans the bar code of the wafer report, and generates scan data according to the bar code. The tablet computer device is electrically connected to the scanning device and receives the scan data. The tablet computer device has a display, on which the inspected wafer is disposed. The display generates at least one display signal and at least one recognition signal according to the scan data, wherein the display signal is for alignment of the wafer, and the recognition signal is displayed at a position where the LED die does not pass the inspection. In addition, the die sucking device sucks the LED die at the position where the recognition signal is generated. Thus, the computer visual recognition output image-aided LED die sorting system utilizes the scanning device to scan the inspection result of the optical inspection device, and transfers the scan data to the tablet computer device electrically connected thereto. Then, the display of the tablet computer device generates the recognition signal at the position where the LED die does not pass the inspection, so that the user directly determines the LED die, which does not pass the inspection, according to the recognition signal. Then, the die sucking device 6 directs sucks the LED die, which does not pass the inspection. Therefore, the step of picking out whether the wafers have defects one after one by the manpower can be effectively solved, so that the manpower cost can be effectively decreased while the quality yield and the production speed can be enhanced.

The invention further provides a computer visual recognition output image-aided LED die sorting method, comprising the steps of: providing a plurality of wafers each having a plurality of LED dies; disposing a plurality of wafer positioning modules, for positioning the wafers, on a carrier jig; disposing the carrier jig in an optical inspection device to perform inspection and removing and unloading the wafers after the inspection; generating at least one wafer report by the optical inspection device, and scanning a bar code of the wafer report by a scanning device to generate scan data; providing a tablet computer device to receive the scan data and generate a display signal according to the scan data, generating a recognition signal at a position where one of the LED dies does not pass the inspection, and displaying the display signal and the recognition signal on a display; disposing the wafer on the display and aligning the wafer with the display signal; and using a die sucking device to discard the LED die at the position where the recognition signal is generated.

Thus, the computer visual recognition output image-aided LED die sorting method can utilize the scanning device to scan the inspection result of the optical inspection device, and transfers the scan data to the tablet computer device. Then, the display of the tablet computer device generates the recognition signal at the position where the LED die does not pass the inspection. When the wafer is disposed on the display, the user can directly determine the LED die, which does not pass the inspection, according to the recognition signal. Then, the die sucking device 6 directly sucks the LED die, which does not pass the inspection. Therefore, the step of picking out whether the wafers have defects one after one by the manpower can be effectively solved, so that the manpower cost can be effectively decreased while the quality yield and the production speed can be enhanced.

BRIEF DESCRIPTION OF THE DRAWINGS

FIG. 10 is a schematic view showing a third preferred embodiment of the invention.

DETAILED DESCRIPTION OF THE PREFERRED EMBODIMENTS

Figure 1:
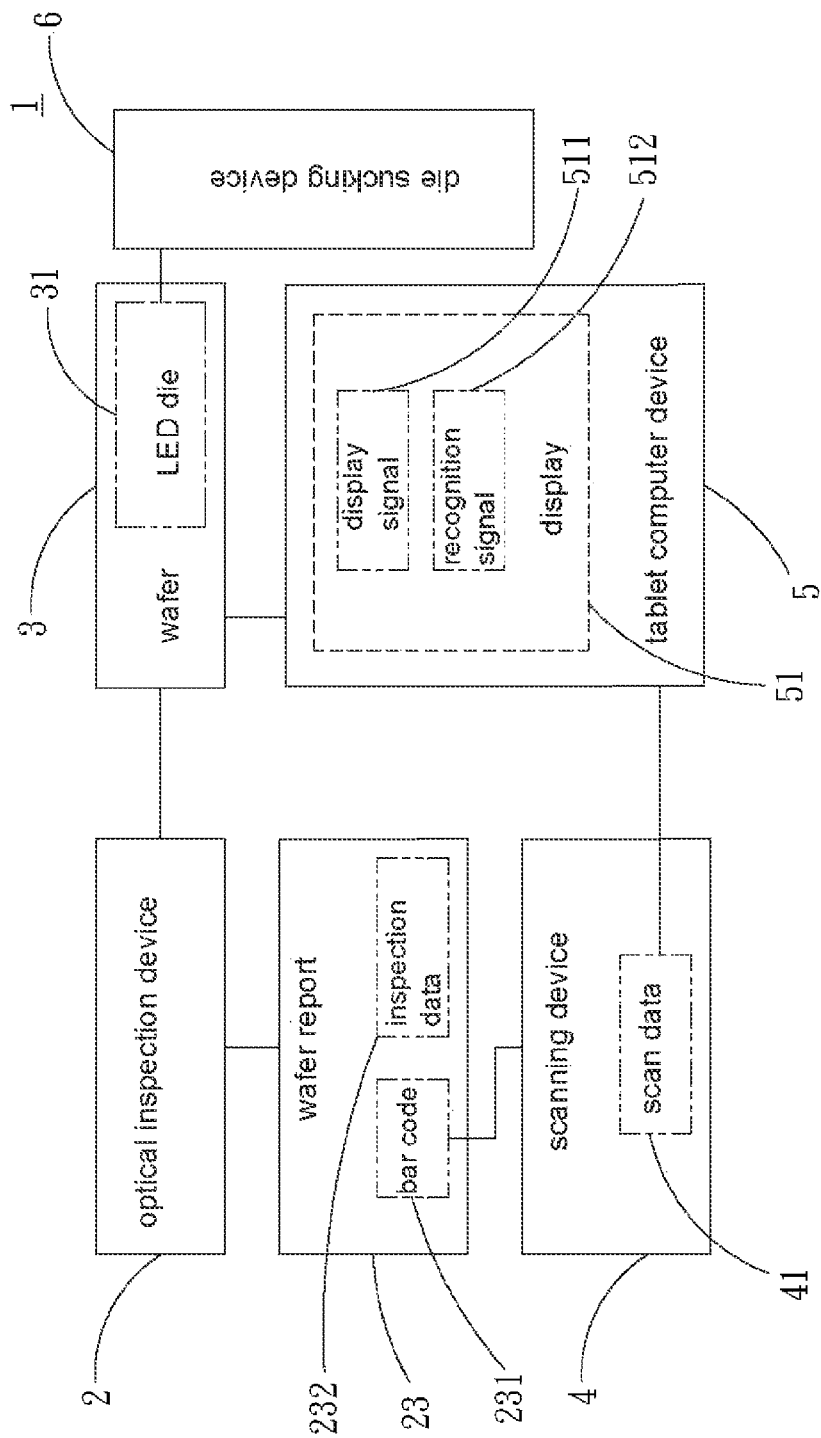
FIG. 1 is a schematic block diagram showing a first preferred embodiment of the invention.
Figure 2:
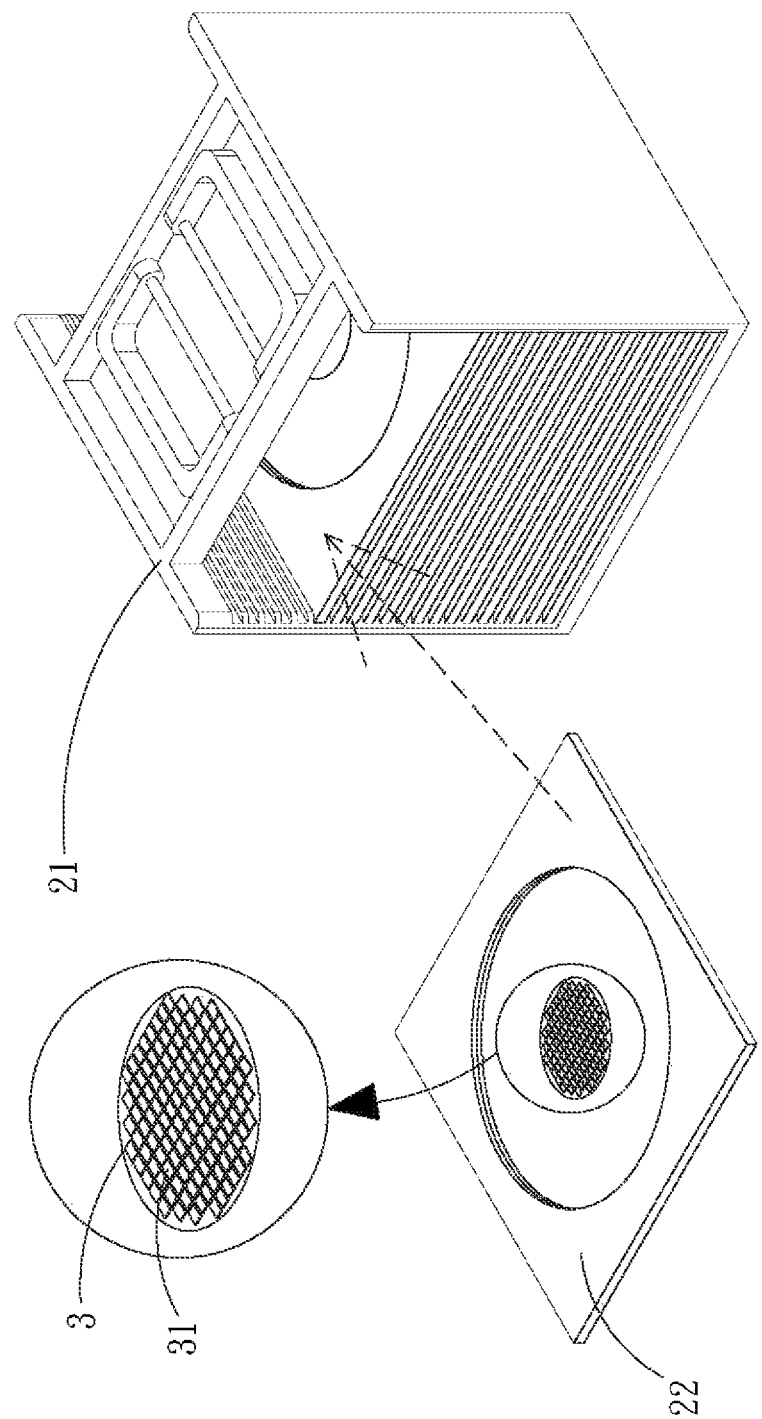
FIG. 2 is a first schematic view showing the implementation of the first preferred embodiment of the invention.
Figure 3:
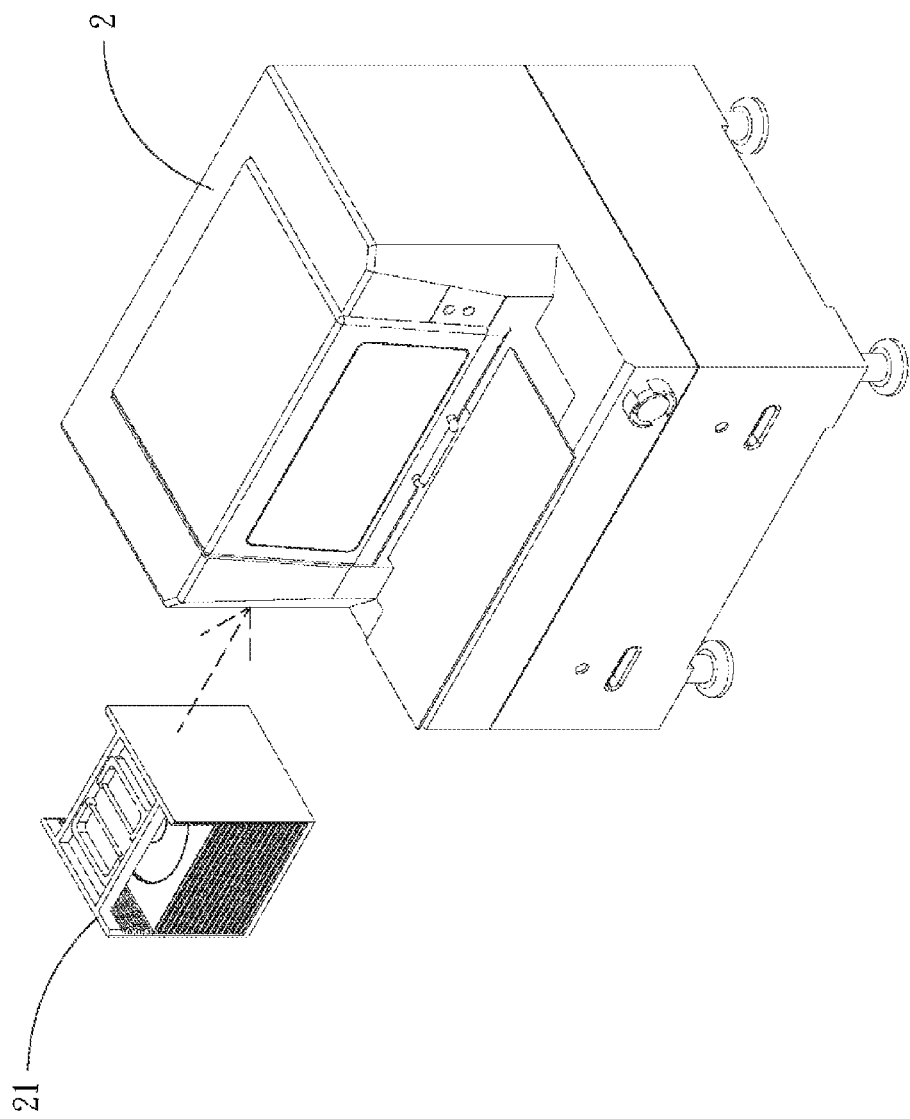
FIG. 3 is a second schematic view showing the implementation of the first preferred embodiment of the invention.
Figure 4:
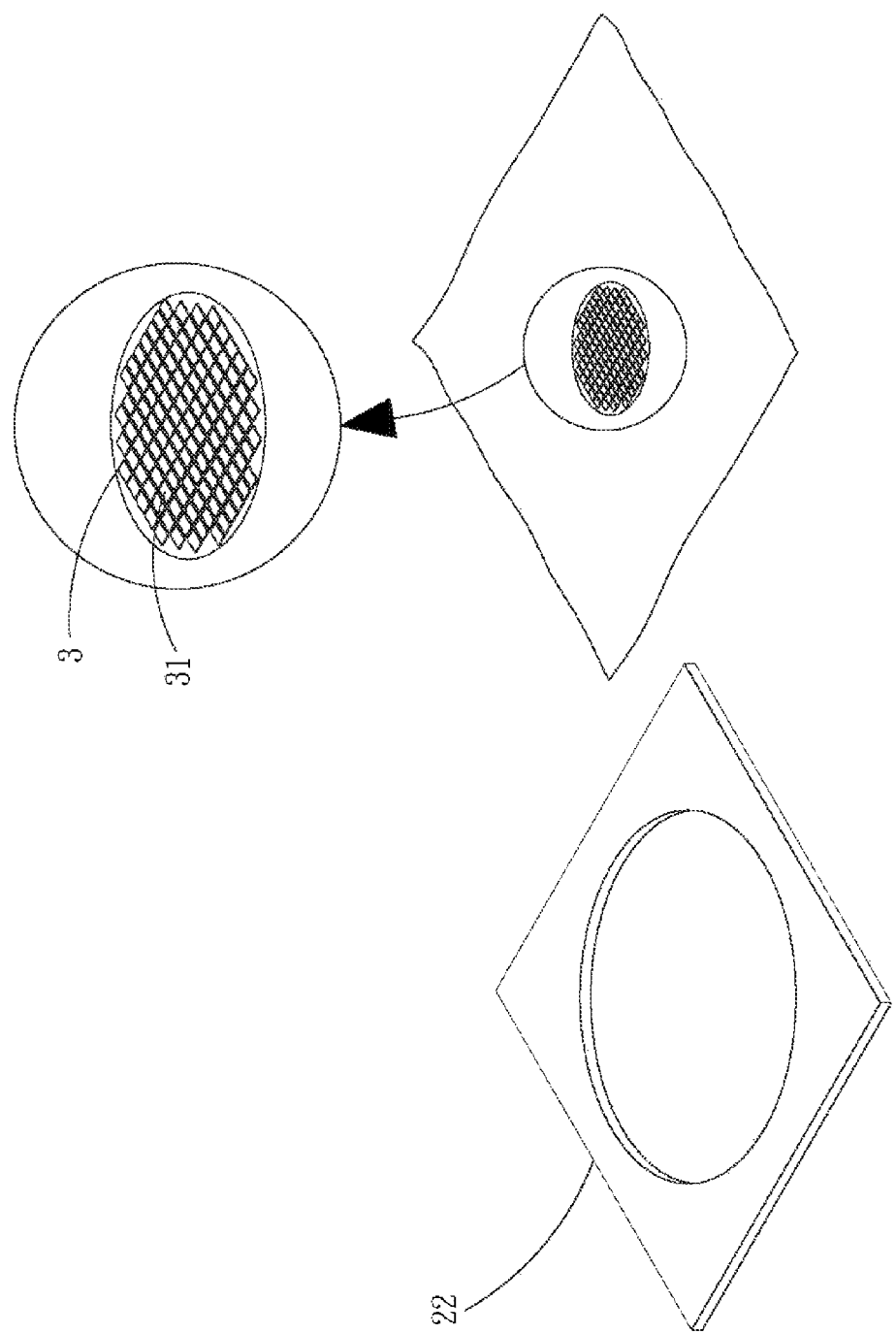
FIG. 4 is a third schematic view showing the implementation of the first preferred embodiment of the invention.

The above-identified objects, structures and functions of the invention will be described according to the following preferred embodiments in conjunction with the accompanying drawings.

FIGS. 1 to 4 are a schematic block diagram, a first schematic view, a second schematic view and a third schematic view showing the implementation of the first preferred embodiment of the invention, wherein the computer visual recognition output image-aided LED die sorting system 1 comprises an optical inspection device 2, a scanning device 4, a tablet computer device 5 and a die sucking device 6.

The optical inspection device 2 has at least one carrier jig 21, on which a plurality of wafer positioning modules 22 may be disposed. A wafer 3 may be positioned on each wafer positioning module 22. Each wafer 3 has a plurality of LED dies 31. After the carrier jig 21 carries the wafer 3, the carrier jig 21 is transported into the optical inspection device 2. The optical inspection device 2 can inspect the wafer 3 on each wafer positioning module 22 to find the defect LED die or dies 31. The inspected wafer 3 is transported out by the optical inspection device 2 and then removed from the carrier jig 21, and then the fixed wafer 3 is separated from the wafer positioning module 22.

Figure 5:
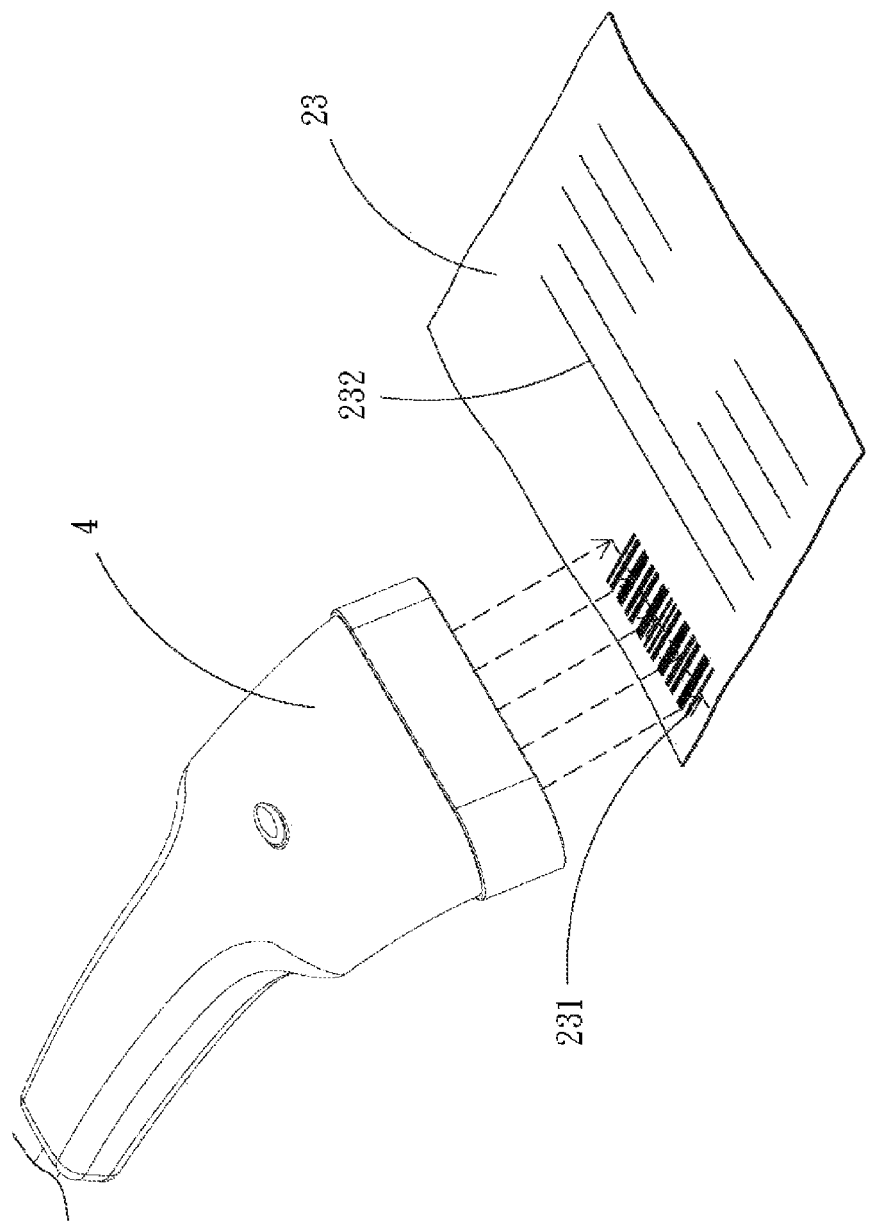
FIG. 5 is a fourth schematic view showing the implementation of the first preferred embodiment of the invention.
Figure 6:
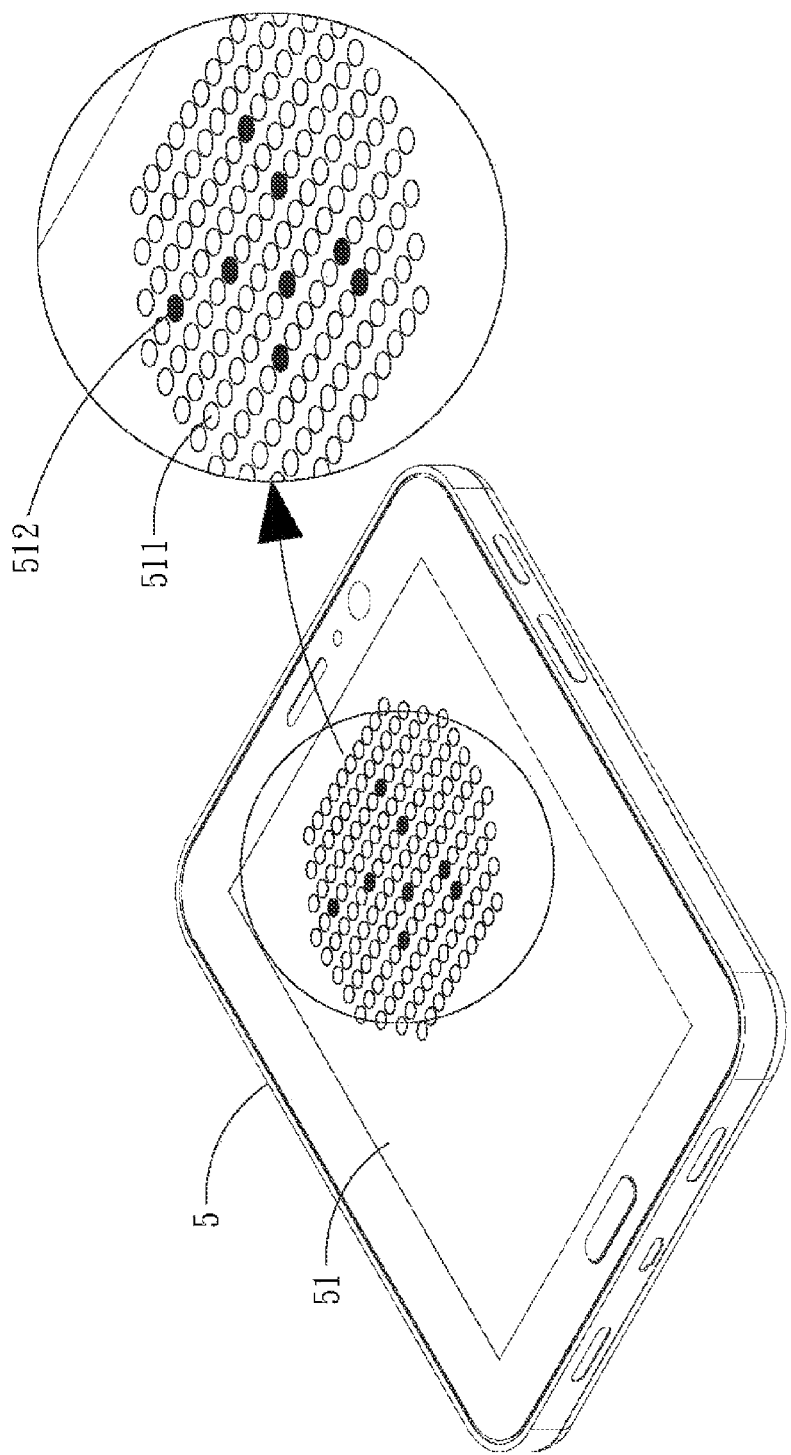
FIG. 6 is a fifth schematic view showing the implementation of the first preferred embodiment of the invention.

FIGS. 1, 5 and 6 are the schematic block diagram, a fourth schematic view and a fifth schematic view showing the implementation of the first preferred embodiment of the invention, wherein the optical inspection device 2 generates a wafer report 23 after the wafer 3 is inspected. Each wafer report 23 is generated according to each wafer 3, and the wafer report 23 comprises a bar code 231 and inspection data 232 for each wafer 3. The scanning device 4 scans the bar code 231 of the wafer report 23, and generates scan data 41 according to the bar code 231, wherein the scan data 41 is transferred to the tablet computer device 5. The tablet computer device 5 has a processing unit (not shown), which performs conversion on the scan data 41 received by the tablet computer device 5. A display signal 511 and a recognition signal 512 are presented on a display 51 of the tablet computer device 5, wherein the range size generated from the display signal 511 is equal to the range size of the wafer 3, so that the unloaded wafer 3 can be disposed in an aligned manner. Different light sources on the display 51 are generated from the recognition signal 512.

Figure 7:
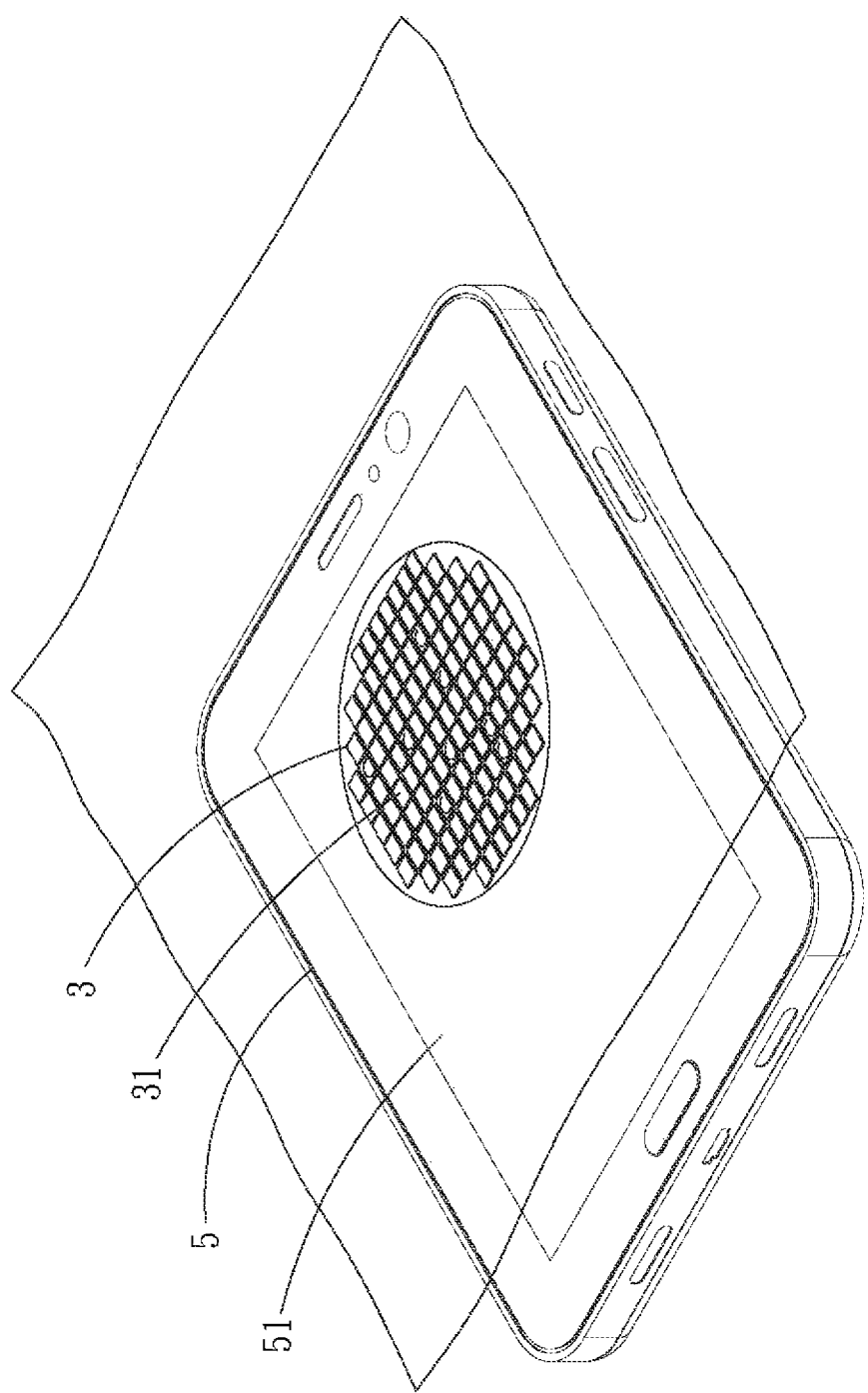
FIG. 7 is a sixth schematic view showing the implementation of the first preferred embodiment of the invention.
Figure 8:
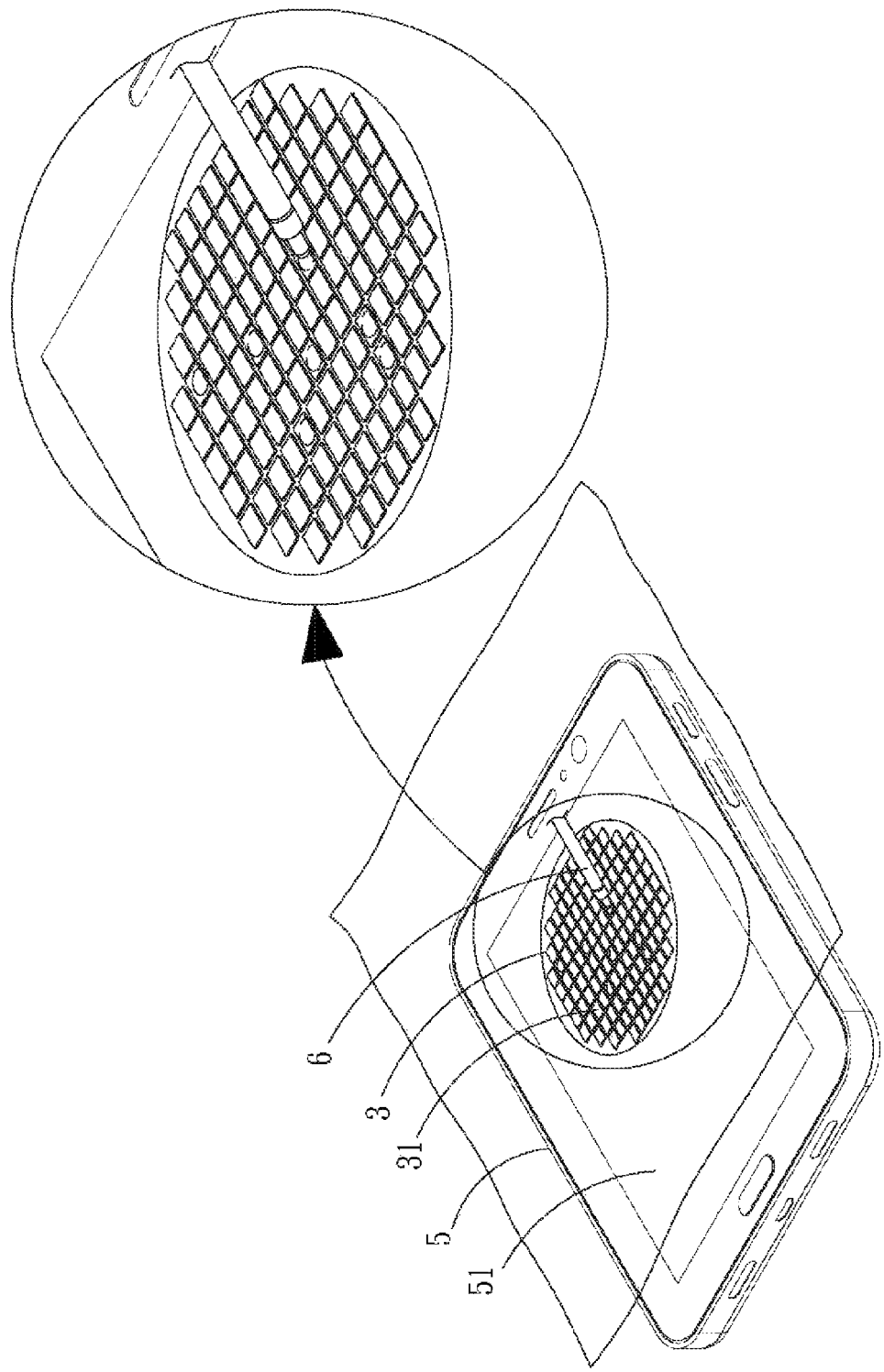
FIG. 8 is a seventh schematic view showing the implementation of the first preferred embodiment of the invention.

FIGS. 1, 7 and 8 are the schematic block diagram, a sixth schematic view and a seventh schematic view showing the implementation of the first preferred embodiment of the invention, wherein after the display signal 511 and the recognition signal 512 on the display 51 of the tablet computer device 5 are generated, the unloaded wafer 3 can be disposed on the display 51, and the wafer 3 can be aligned according to the display signal 511. After the wafer 3 is positioned, some LED dies 31 of the wafer 3 generate light sources through the recognition signal 512, wherein the LED die 31 generating the light source is the defect LED die 31 inspected by the optical inspection device 2. That is, the recognition signal 512 firstly refers to the relative position between the display signal 511 and the wafer 3, and the light source is generated at the position wherein the LED die 31 does not pass the inspection. After the wafer 3 is positioned, the LED die 31 generating the light source is also the LED die 31, which does not pass the inspection of the optical inspection device 2. The display 51 does not generate the recognition signal 512 at the position where the LED die 31 passes the inspection, and the user can directly determine the position of the LED die 31, which does not pass the inspection, through the recognition signal 512, and then the die sucking device 6 directly sucks the LED die 31, which does not pass the inspection. Therefore, the step of picking out whether the wafers 3 have defects one after one by the manpower can be effectively solved, so that the manpower cost can be effectively decreased while the quality yield and the production speed can be enhanced.

Figure 9:
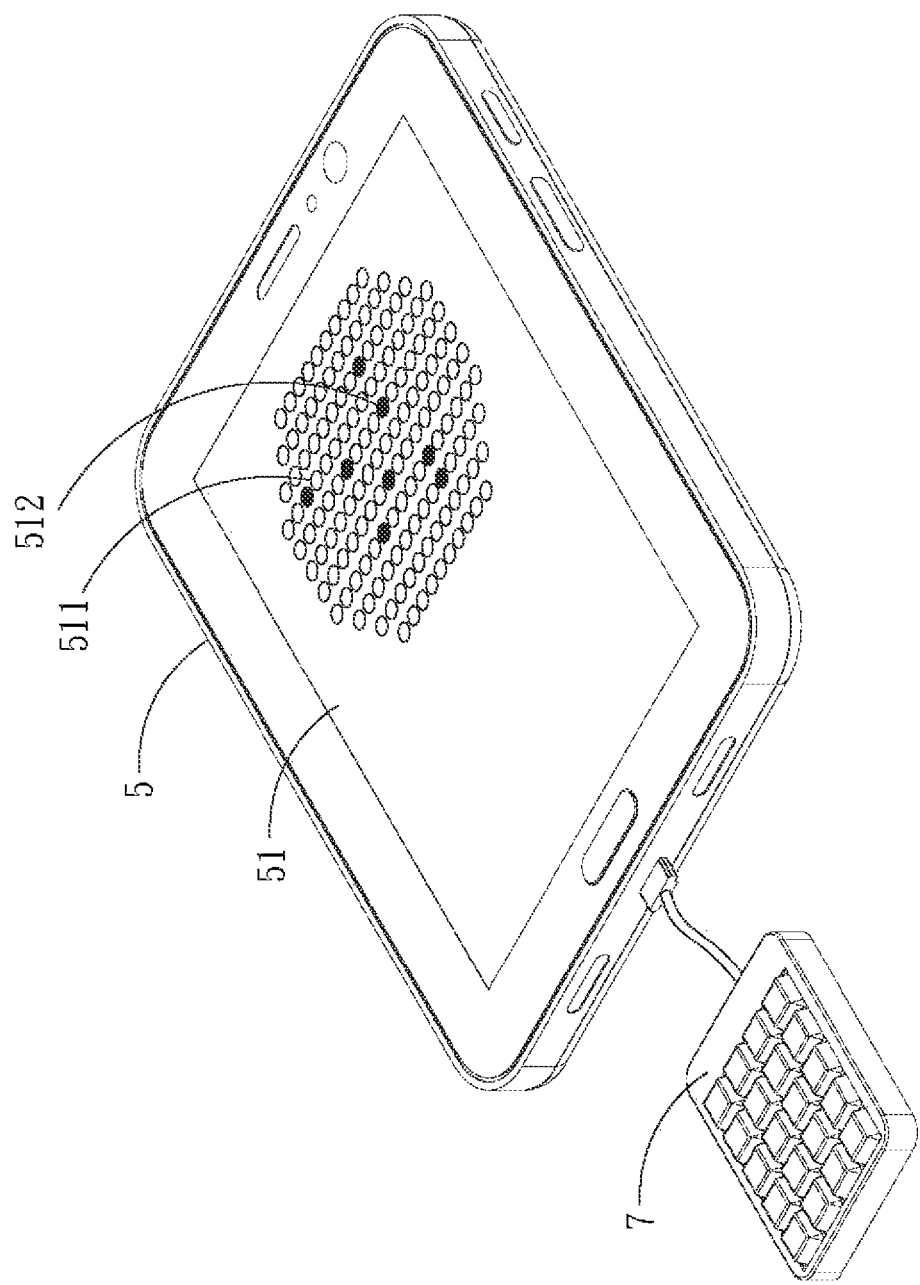
FIG. 9 is a schematic view showing a second preferred embodiment of the invention.

FIG. 9 is a schematic view showing a second preferred embodiment of the invention. Referring to FIG. 9, this preferred embodiment is substantially the same as the first preferred embodiment in the connection relationships and effects, wherein the main difference between the second and first preferred embodiments resides in that the computer visual recognition output image-aided LED die sorting system 1 further comprises a control device 7, which is electrically connected to the tablet computer device 5. When the wafer 3 (see FIG. 7) is disposed on the display 51 and is aligned according to the display signal 511, the control device 7 can control the positions of the display signal 511 and the recognition signal 512 on the display 51.

FIG. 10 is a schematic view showing a third preferred embodiment of the invention. Referring further to FIG. 10 in conjunction with FIG. 1, the third preferred embodiment is substantially the same as the first preferred embodiment in the connection relationships and effects, wherein the main difference between the third and first preferred embodiments resides in that the wafer report 23 generated by the optical inspection device 2 is uploaded to a network server 8, and the tablet computer device 5 downloads the wafer report 23 from the network server 8 through the network.

Figure 11:
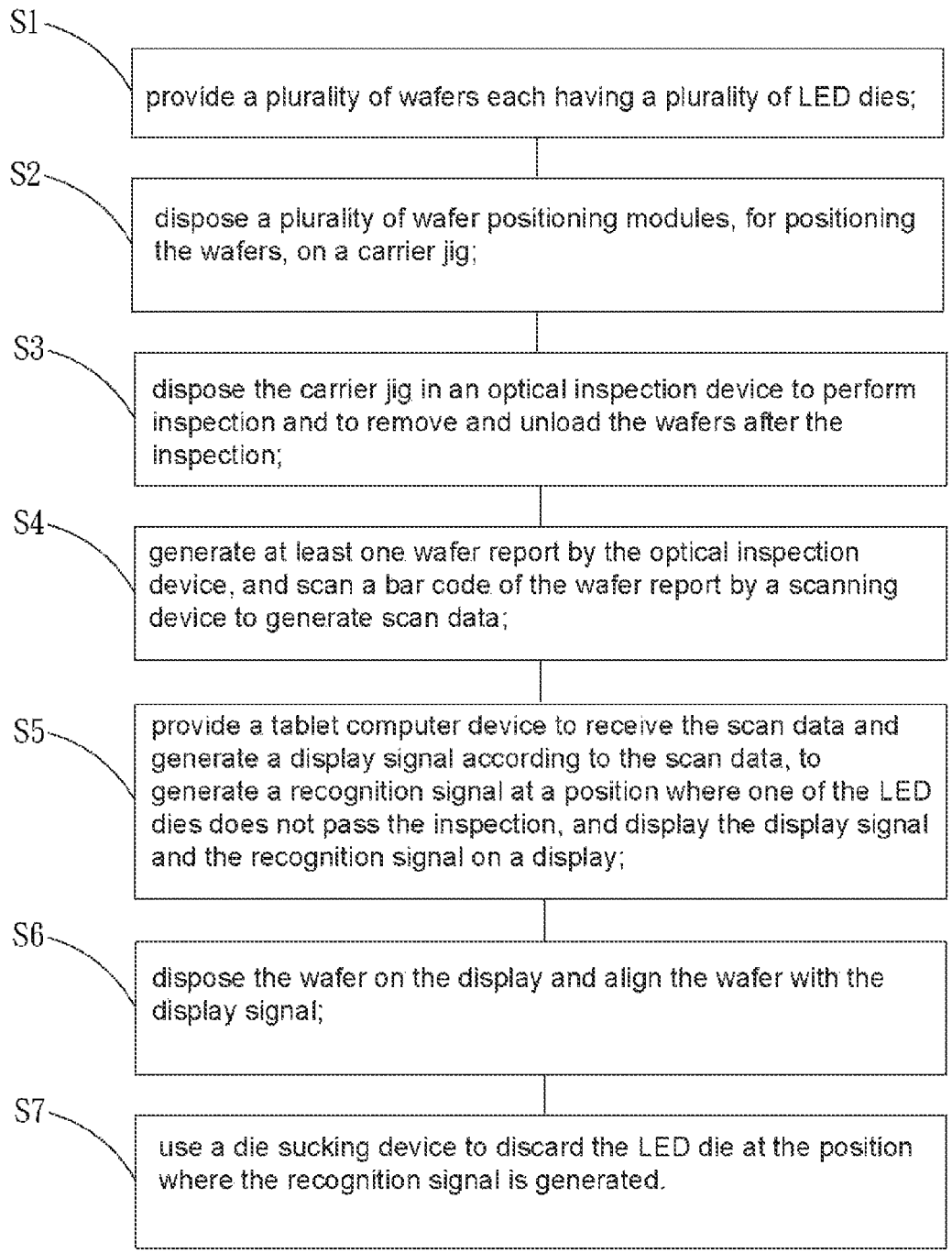
FIG. 11 is a flow chart showing a sorting method according to the first preferred embodiment of the invention.

FIG. 11 is a flow chart showing a sorting method according to the first preferred embodiment of the invention. Referring to FIG. 11 in conjunction with FIG. 1, the computer visual recognition output image-aided LED die sorting method comprises the following steps.

S1 is to provide a plurality of wafers each having a plurality of LED dies; wherein a plurality of wafers 3 is provided, and each wafer 3 has a plurality of LED dies 31.

S2 is to dispose a plurality of wafer positioning modules, for positioning the wafers, on a carrier jig; wherein the wafer positioning modules 22 for positioning the wafers 3 are disposed on the carrier jig 21.

S3 is to dispose the carrier jig in an optical inspection device to perform inspection and to remove and unload the wafers after the inspection; wherein the carrier jig 21 is transported into the optical inspection device 2, and the optical inspection device 2 can inspect the wafer 3 on each wafer positioning module 22 to find the defect LED die 31. The inspected wafer 3 is removed from the optical inspection device 2 and unloaded from the carrier jig 21, and then the fixed wafer 3 and the wafer positioning module 22 are separated from each other.

S4 is to generate at least one wafer report by the optical inspection device, and scan a bar code of the wafer report by a scanning device to generate scan data; wherein the optical inspection device 2 generates the wafer report 23 after the wafer 3 is inspected, each wafer report 23 is generated according to each wafer 3, and the wafer report 23 comprises the bar code 231 and the inspection data 232 pertaining to each wafer 3. Then, the scanning device 4 scans the bar code 231 of the wafer report 23 and generates the scan data 41 through the bar code 231.

S5 is to provide a tablet computer device to receive the scan data and generate a display signal according to the scan data, to generate a recognition signal at a position where one of the LED dies does not pass the inspection, and to display the display signal and the recognition signal on a display; wherein the scan data 41 is transferred to the tablet computer device 5, the tablet computer device 5 receives the scan data 41, then the processing unit performs the conversion on the scan data 41, and the display signal 511 and the recognition signal 512 are displayed on the display 51 of the tablet computer device 5. The unloaded wafer 3 can be aligned with the display signal 511, and the recognition signal 512 can generate different light sources on the display 51.

S6 is to dispose the wafer on the display and align the wafer with the display signal; wherein the unloaded wafer 3 is disposed on the display 51, and the wafer 3 can be aligned with the display signal 511.

S7 is to use a die sucking device to discard the LED die at the position where the recognition signal is generated.

Some LED dies 31 of the wafer 3 generate the light sources according to the recognition signal 512, wherein the LED die 31 generating the light source is the defect LED die 31 inspected by the optical inspection device 2. Then, the die sucking device 6 directly sucks the LED die 31 at the position wherein the recognition signal 512 is generated.

Accordingly, the user can directly judge the position of the LED die 31, which does not pass the inspection, according to the recognition signal 512, and then the die sucking device 6 directly sucks the LED die 31, which does not pass the inspection. Therefore, the step of picking out whether the wafers 3 have defects one after one by the manpower can be effectively solved, so that the manpower cost can be effectively decreased while the quality yield and the production speed can be enhanced.

Figure 12:
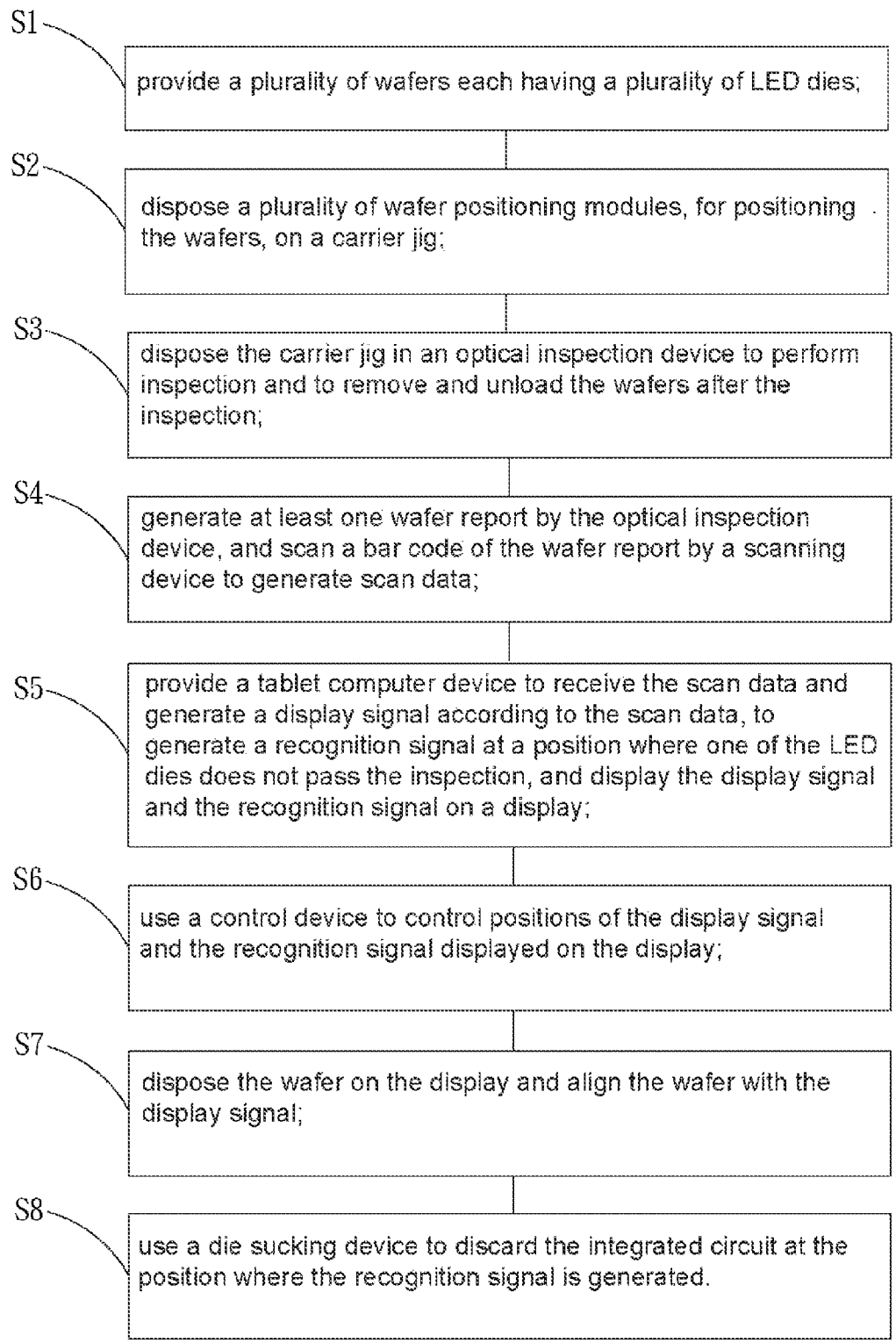
FIG. 12 is a flow chart showing a sorting method according to the second preferred embodiment of the invention.

FIG. 12 is a flow chart showing a sorting method according to the second preferred embodiment of the invention. Referring to FIG. 12 in conjunction with FIG. 1, the second preferred embodiment is substantially the same as the sorting method of the first preferred embodiment in the steps and effects, wherein the main difference between the embodiments resides in that the method further comprises the steps S6 to S8 after the display signal 511 and the recognition signal 512 are displayed on the display 51.

The step S6 is to use a control device to control positions of the display signal 511 and the recognition signal 512 displayed on the display 51.

The step S7 is to dispose the wafer on the display and align the wafer with the display signal.

The step S8 is to use a die sucking device to discard the LED die at the position where the recognition signal is generated.

Figure 13:
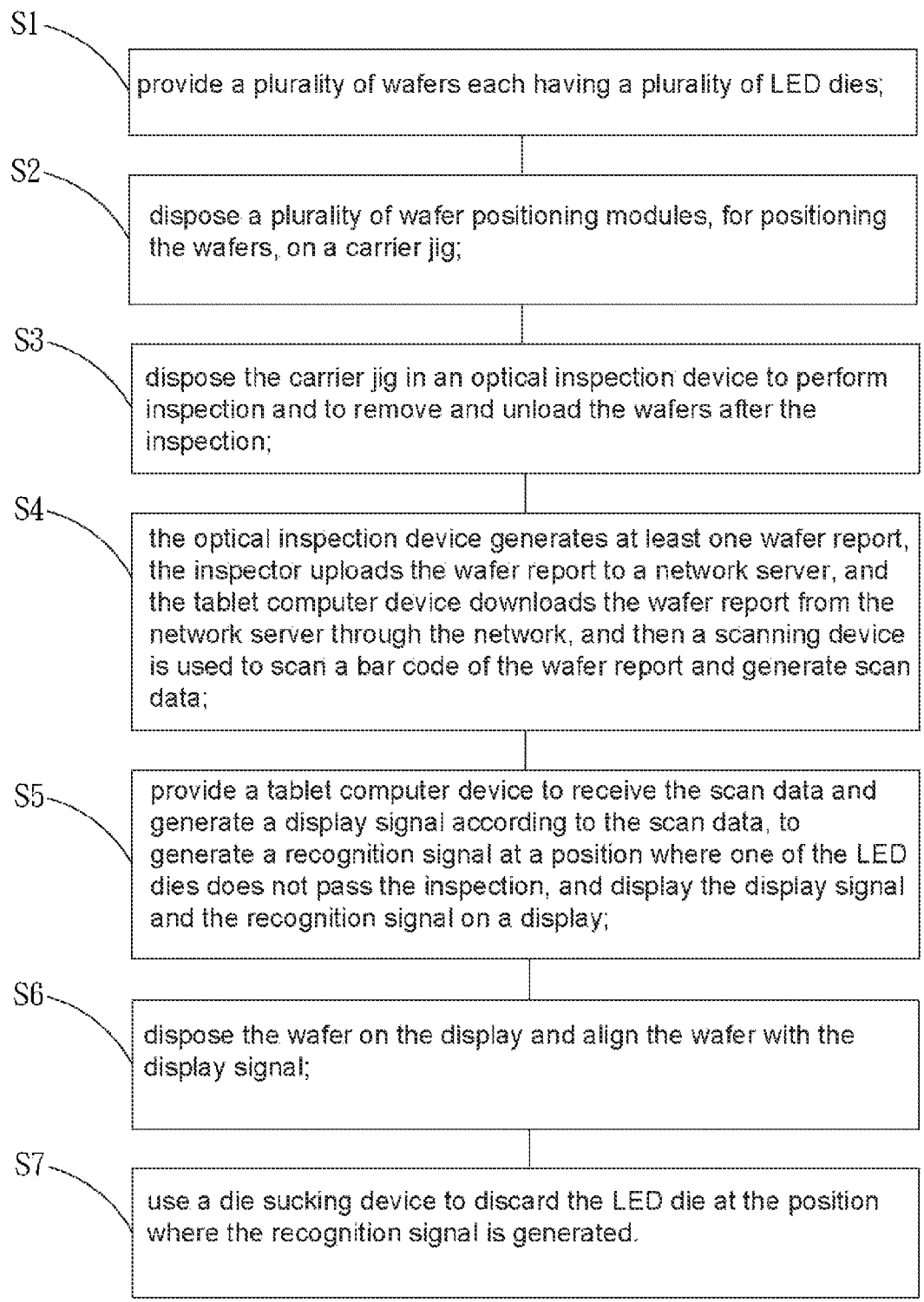
FIG. 13 is a flow chart showing a sorting method according to the third preferred embodiment of the invention.

FIG. 13 is a flow chart showing a sorting method according to the third preferred embodiment of the invention. Referring to FIG. 13 in conjunction with FIG. 1, the third preferred embodiment is substantially the same as the sorting method of the first preferred embodiment in the steps and effects, wherein the main difference between the embodiments resides in the step S4. The step 34 is to use the optical inspection device to generate at least one wafer report, and the inspector uploads the wafer report to a network server. The tablet computer device downloads the wafer report from the network server through the network, and a scanning device is used to scan the bar code of the wafer report to generate the scan data.

The wafer report 23, generated by the optical inspection device 2, is uploaded to a network server 8, and the tablet computer device 5 downloads the wafer report 23 from the network server 8 through the network.

An application program (APP) is installed in the tablet computer device 5, and the APP is executed to download the wafer report 23 from the network server 8 through the network.

To sum up, the computer visual recognition output image-aided LED die sorting system and sorting method according to the invention have the following advantages. First, the cost is decreased. Second, the quality yield is enhanced. Third, the production speed is increased.

New characteristics and advantages of the invention covered by this document have been set forth in the foregoing description. It is to be expressly understood, however, that the drawings are for the purpose of illustration only and are not intended as a definition of the limits of the invention. Changes in methods, shapes, structures or devices may be made in details without exceeding the scope of the invention by those who are skilled in the art. The scope of the invention is, of course, defined in the language in which the appended claims are expressed.

In summary, the computer visual recognition output image-aided LED die sorting system and sorting method of the invention can indeed achieve the effects and objects thereof when being used. So, the invention has the excellent utility and satisfies the invention patent application and is thus filed according to the law. Favorable consideration and an early Notice of Allowance are earnestly solicited to protect the hard creation of the inventor(s). The inventor(s) will try to solve any issue raised by the examiner.

What is claimed is:

1. A computer visual recognition output image-aided light emitting diode (LED) die sorting system, comprising:
   an optical inspection device having at least one carrier jig;
   a plurality of wafer positioning modules, for positioning wafers, that are disposed on the at least one carrier jig, wherein each of the wafers has a plurality of LED dies, and wherein the optical inspection device inspects the wafers and generates at least one wafer report comprising a bar code and inspection data, the bar code identifying each wafer report;
   a scanning device reading the wafer report and generating scan data according to the bar code;
   a tablet computer device having a display and displaying each of the wafers after being inspected, wherein the tablet computer device is electrically connected to the scanning device and receives the scan data, and the display generates, according to the scan data, at least one display signal and a recognition signal at a position where one of the LED dies does not pass inspection; and
   a die sucking device removing an LED die at the position which generates the recognition signal.

2. The sorting system according to claim 1, wherein the tablet computer device has a processing unit, which generates the display signal and the recognition signal.

3. The sorting system according to claim 1, wherein the die sucking device is a vacuum sucking device.

4. The sorting system according to claim 1, further comprising a control device, which is electrically connected to the tablet computer device and controls positions of the display signal and the recognition signal on the display.

5. The sorting system according to claim 1, wherein the optical inspection device generates the wafer report and uploads the wafer report to a network server, and the tablet computer device downloads the wafer report from the network server through a network.

6. A computer visual recognition output image-aided LED die sorting method, comprising steps of:
   providing a plurality of wafers each having a plurality of LED dies;
   disposing a plurality of wafer positioning modules, which position the wafers, on a carrier jig;
   disposing the carrier jig in an optical inspection device to perform inspection and removing and unloading of the wafers after the inspection;
   generating at least one wafer report by the optical inspection device, and scanning a bar code of the wafer report by a scanning device to generate scan data;
   providing a tablet computer device to receive the scan data and generate a display signal according to the scan data;
   generating a recognition signal based on the scan data at a position where one of the LED dies does not pass the inspection, and displaying the display signal and the recognition signal on the tablet computer device;
   disposing the wafer on the display and aligning the wafer with the display signal; and
   using a die sucking device to discard an LED die at the position where the recognition signal is generated.

7. The sorting method according to claim 6, further comprising, after the optical inspection device generates the wafer report, the step of: uploading the wafer report to a network server by an inspector, wherein the tablet computer device downloads the wafer report from the network server through a network.

8. The sorting method according to claim 7, wherein an application program is installed in the tablet computer device, and the application program is executed to download the wafer report from the network server through the network.

9. The sorting method according to claim 6, further comprising, after the display signal and the recognition signal are displayed on the display, the step of: using a control device to control positions of the display signal and the recognition signal displayed on the display.

* * * * *